United States Patent
Hsu

(10) Patent No.: US 7,242,092 B2
(45) Date of Patent: Jul. 10, 2007

(54) SUBSTRATE ASSEMBLY WITH DIRECT ELECTRICAL CONNECTION AS A SEMICONDUCTOR PACKAGE

(75) Inventor: Shih-Ping Hsu, Hsin-chu (TW)

(73) Assignee: Phoenix Precision Technology Corporation, Hsin-Chu (TW)

( * ) Notice: Subject to any disclaimer, the term of this patent is extended or adjusted under 35 U.S.C. 154(b) by 0 days.

(21) Appl. No.: 11/274,397

(22) Filed: Nov. 14, 2005

(65) Prior Publication Data
US 2006/0186536 A1   Aug. 24, 2006

(30) Foreign Application Priority Data
Feb. 2, 2005 (TW) .............................. 94103157 A

(51) Int. Cl.
*H01L 23/34* (2006.01)
(52) U.S. Cl. ...................... 257/723; 257/678
(58) Field of Classification Search ................ 257/678, 257/723
See application file for complete search history.

(56) References Cited

U.S. PATENT DOCUMENTS 5,432,677 A * 7/1995 Mowatt et al. ............. 361/719
5,562,971 A * 10/1996 Tsuru et al. ................ 428/209
5,583,377 A * 12/1996 Higgins, III ................ 257/707
6,709,898 B1   3/2004 Ma et al.

\* cited by examiner

*Primary Examiner*—Roy Potter
(74) *Attorney, Agent, or Firm*—Sawyer Law Group LLP

(57) ABSTRACT

A substrate assembly with direct electrical connection as a semiconductor package is disclosed, which includes a carrier structure formed with at least a cavity; at least a semiconductor chip received in the cavity of the carrier structure having a plurality of electrically connecting pads formed thereon; at least a build-up circuit structure formed on the semiconductor chip and the carrier structure, wherein the build-up circuit structure has conductive structures for electrically connecting to the electrically connecting pads of the semiconductor chip; and a heat sink partially attached to the carrier structure for sealing the cavity. In that the heat sink directly contacts the semiconductor chip, heat generated during operation of the chip can be effectively dissipated, and more mounting space is provided for mounting electronic components, enhancing the electrical property thereof.

20 Claims, 3 Drawing Sheets

SUBSTRATE ASSEMBLY WITH DIRECT ELECTRICAL CONNECTION AS A SEMICONDUCTOR PACKAGE

FIELD OF THE INVENTION

The present invention relates to substrate assemblies with direct electrical connection as semiconductor packages, and more particularly, to a semiconductor package structure integrating a semiconductor chip and a corresponding carrier structure.

BACKGROUND OF THE INVENTION

With the rapid development of the electronics industry, the profiles of electronic products tend to be thin, short, and small, and the functions thereof tend to be high performance in terms of functionality and speed. To satisfy the package requirements for high integration and miniaturization, circuit boards providing a plurality of active and passive components and circuit connections are typically designed as multi-layer boards instead of single-layer boards, so as to enlarge the usable circuit area of the circuit boards via interlayer connection technology to satisfy the requirement for high circuit density.

However, with the increase in the number of conductive trace layers and the component density of the circuit board, heat generated in the operation of semiconductor chips utilizing high integration techniques is also greatly increased. Consequently, a semiconductor package can overheat. Furthermore, the life-span of the semiconductor chip will be reduced if heat is not adequately dissipated. Currently, the ball grid array (BGA) structure used for packages cannot meet the electrical and heat dissipation requirements under circumstances with a high pin count (1500+ pins) or high frequency (5+ GHz). The flip chip ball grid array (FCBGA) structure can be used in products having such pin counts and frequencies; however, the package cost is high, and there are many limitations for this technology, especially in terms of the electrically connectivity thereof. Moreover, for the sake of environmental protection, many electrical connecting materials, such as lead, a soldering material, are discouraged, but the electrical and mechanical qualities of substitute materials are generally not as stable.

For these reasons, a package involving a semiconductor chip embedded in a substrate has been proposed. As shown in FIG. 1, U.S. Pat. No. 6,709,898 discloses a semiconductor package having a heat dissipating function. As shown in the figure, the semiconductor package comprises a heat sink 102 having at least one recess 104; a semiconductor chip 114 having a non-active surface 118 that is mounted in a recess 104 via a heat-conductive adhesive material 120; and a build-up circuit structure 122 formed on the heat sink 102 and the semiconductor chip 114 via build-up circuit technology.

Referring to FIG. 2, a cross-sectional view of the heat sink 102 is illustrated. As shown in the figure, the recesses 104 of the heat sink 102 are extended to a certain depth to form a cavity from the upper surface of the heat sink 102.

Referring to FIG. 3, the material of the heat sink 102 supporting the semiconductor chip 114 utilizes an integral metallic material. Although a half-etching method can be used to firstly form the recess 104 receiving the semiconductor chip 114, the uniformity of such etching is difficult to control such that each of the recesses 104 in the whole heat sink 102 may be formed unevenly, which would not achieve an even plane. In such case, the mounting and connecting of semiconductor components might be affected, the height and uniformity of which would be more difficult to control, or worse, the quality and reliability of subsequent build-up circuit fabricating procedures could be affected.

In addition, the miniaturization of electronic products has long been a trend, and electronic products having a single function cannot satisfy the requirements of customers any more. Nowadays, portable electronic products, such as a multiple function electronic product combining a mobile phone and a digital camera, often combine multiple functions. Consequently, in the electronics industry, single-function integrated circuits have evolved into multi-function, high performance devices. An integrated circuit having multiple functions frequently serves as the main structure or component for a device, with various passive components, such as resistors, capacitors or inductances, connected to the input/output connections thereof to cooperatively provide said functions. But space must be provided for such passive components. However, another problem with the semiconductor package having heat dissipating function disclosed in the above US patent is that there is often little or no room for receiving passive components, leaving the goal of full modularization unachieved; and, because there is insufficient room for receiving other electronic components, the integrated circuit can not be effectively utilized in terms of incorporated functionality and connectivity.

SUMMARY OF THE INVENTION

Regarding the drawbacks of the above-mentioned conventional technologies, the primary objective of the present invention is to provide a substrate assembly with direct electrical connection as a semiconductor package for integrating both the semiconductor chip and the corresponding carrier structure to enhance the heat dissipation ability thereof.

Another objective of the present invention is to provide a substrate assembly with direct electrical connection as a semiconductor package for evenly controlling the uniformity of the carrier structure and the mounting surface of the semiconductor chip.

Still another objective of the present invention is to provide a substrate assembly with direct electrical connection as a semiconductor package for enhancing the quality and electrical connecting reliability of the fabricating procedures of a subsequent build-up circuit structure.

Still another objective of the present invention is to provide a substrate assembly with direct electrical connection as a semiconductor package for increasing flexibility on utilizing the space of the structure thereof.

Still another objective of the present invention is to provide a substrate assembly with direct electrical connection as a semiconductor package for effectively integrating active and passive components to enhance the electrical properties thereof.

In accordance with the above and other objectives, the present invention proposes a substrate assembly with direct electrical connection as a semiconductor package, comprising: a carrier structure having at least a cavity; at least a semiconductor chip received in the cavity of the carrier structure, a surface of the semiconductor chip forming electrically connecting pads; at least a build-up circuit structure formed on the semiconductor chip and the carrier structure, the build-up circuit structure forming a plurality of conductive structures for electrically connecting the electrically connecting pads of the semiconductor chip; and a heat sink partially mounted on the carrier structure to seal an end of the cavity and contact the semiconductor chip. In addition, a plurality of conductive elements can be arranged on the surface circuits of the build-up circuit structure for electrically connecting the package structure to external electronic devices.

In another embodiment of the present invention, the carrier structure can be a circuit board having a plurality of interlayer conductive structures and circuit structures, wherein various electronic components (such as active or passive components) can be mounted at a lower surface of the carrier structure at a location where the a heat sink is not mounted. The electronic components can be further electrically connected to the semiconductor chip via the circuit structures, the interlayer conductive structures, and the circuits formed on the semiconductor chip and the circuit board (carrier structure), in order to achieve flexibility in utilizing the structure space and enhancing the electrical property thereof.

In another embodiment of the present invention, the carrier structure can be a multi-layer structure, each layer thereof forming at least a corresponding cavities, the size of the cavities of upper layers is greater than that of lower layers, so as to form mounting area. Various electronic components can be arranged on the mounting area for achieving flexibility in utilizing the structure space. The carrier structure can be made of high heat-conductive material to effectively dissipate the heat of the electronic components mounted on the mounting area of the multi-layer carrier structure. In addition, the multi-layer carrier structure can be a circuit board, so that various electronic components (such as active or passive components) are mounted at the lower portion of the circuit board (carrier structure) at a location where the heat sink is not mounted. The electronic components can be electrically connected with the semiconductor chip received in the carrier structure via the circuit structure of the circuit board, the interlayer conductive structures, and the build-up circuit structure formed on the semiconductor chip and the circuit board (carrier structure), in order to enhance the electrical properties thereof.

DETAILED DESCRIPTION OF THE PREFERRED EMBODIMENTS

The figures of each of the embodiments of the present invention schematically illustrate the basic structure of the present invention, showing only structures relating to the present invention. Features are not necessarily drawn to scale in relation to other features, and the number, shape, and size of the components can be selectively chosen in practical embodiments, and the structure thereof may be more complicated.

Figure 1:
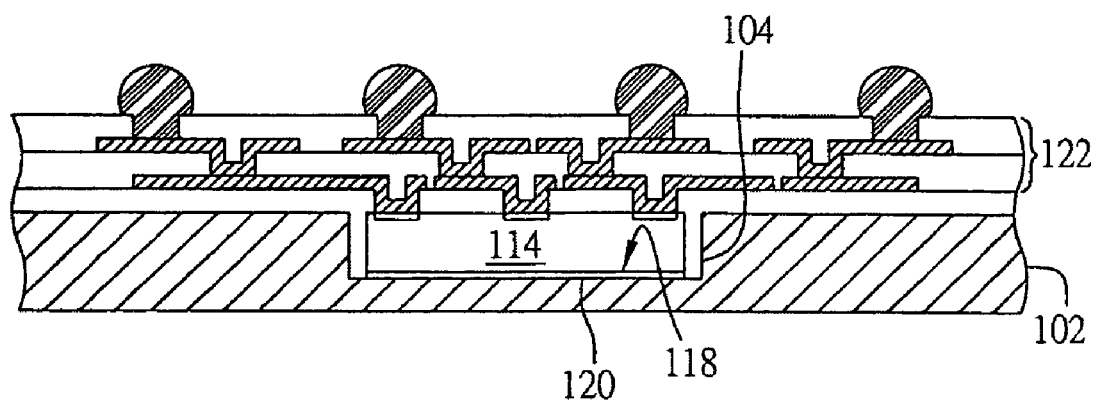
FIG. 1 (PRIOR ART) is a schematic cross-sectional view of the semiconductor package structure disclosed in U.S. Pat. No. 6,709,898.
Figure 2:
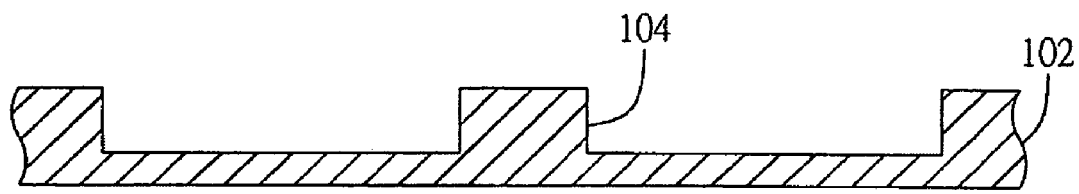
FIG. 2 (PRIOR ART) is a schematic cross-sectional view of the heat sink disclosed in U.S. Pat. No. 6,709,898.
Figure 3:
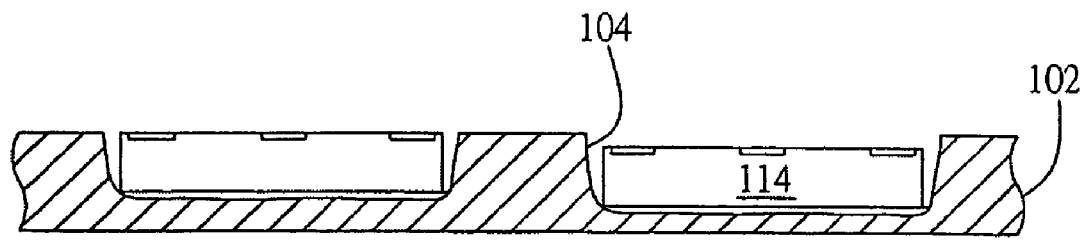
FIG. 3 (PRIOR ART) is a partial schematic cross-sectional view showing a uniformity problem that can sometimes occur when the heat sink shown in FIG. 2 receives semiconductor chips.
Figure 4:
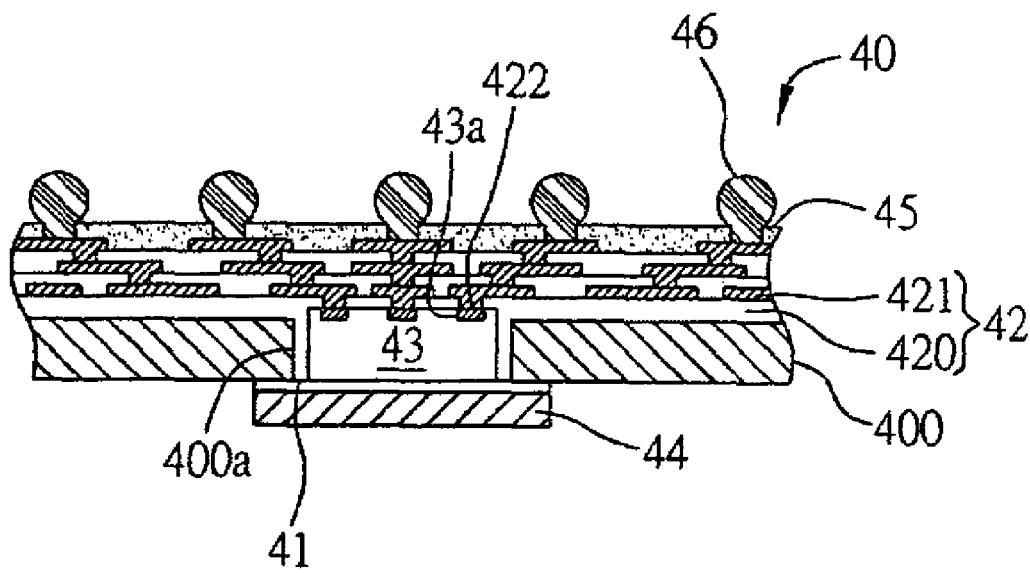
FIG. 4 is a schematic cross-sectional view of a first embodiment of the substrate assembly with direct electrical connection as a semiconductor package of the present invention.

Referring to FIG. 4, a schematic cross-sectional view of the substrate assembly with direct electrical connection as a semiconductor of the present invention is shown. The semiconductor package structure 40 comprises: a carrier structure such as a carrier board 400, wherein the material of the carrier board can be metal plate or insulating plate, and the carrier board 400 forms at least a cavity 400a running through its surface; at lease a semiconductor chip 43 received in the cavity 400a of the carrier board, wherein a surface of the semiconductor chip comprises electrically connecting pads 43a for electrically connecting; at least a build-up circuit structure 42 formed on the semiconductor chip 43 and the carrier board 400, the build-up circuit structure 42 comprising a dielectric layer 420, a circuit layer 421 formed on the dielectric layer 420, and conductive structures 422 running through the dielectric layer 420 for electrically connecting the circuit layer 421, in which the conductive structures 422 can be conductive vias, the conductive structures are electrically connected to the electrically connecting pads 43a of the semiconductor chip 43 received in the cavity 400a of the carrier board 400, the material of the dielectric layer 420 can be fiber reinforced resin, phenolic polyester, epoxy resin layer or optic sensitive resin, and the dielectric layer 420 is arranged on the semiconductor chip 43 and the carrier board 400 to fill in the gaps between the semiconductor chip 43 and the carrier board 400; and a heat sink 44 partially mounted on the carrier board 400 via a heat conductive adhesive 41 to seal the cavity 400a of the carrier board, the heat sink 44 contacting the semiconductor chip 43. Furthermore, a solder mask 45 can be formed on the surface of the build-up circuit structure 42, the solder mask 45 forming a plurality of cavities to expose the surface of the circuits portion of the build-up circuit structure 42 for forming a plurality of conductive components such as solder balls 46 for electrically connecting the semiconductor chip 43 embedded in the carrier board 400 to external devices. Only a portion of the heat sink is arranged at the position mounting the semiconductor chip 43, so that the carrier board 400 has relatively greater room for receiving other electronic components in following procedures.

Figure 5:
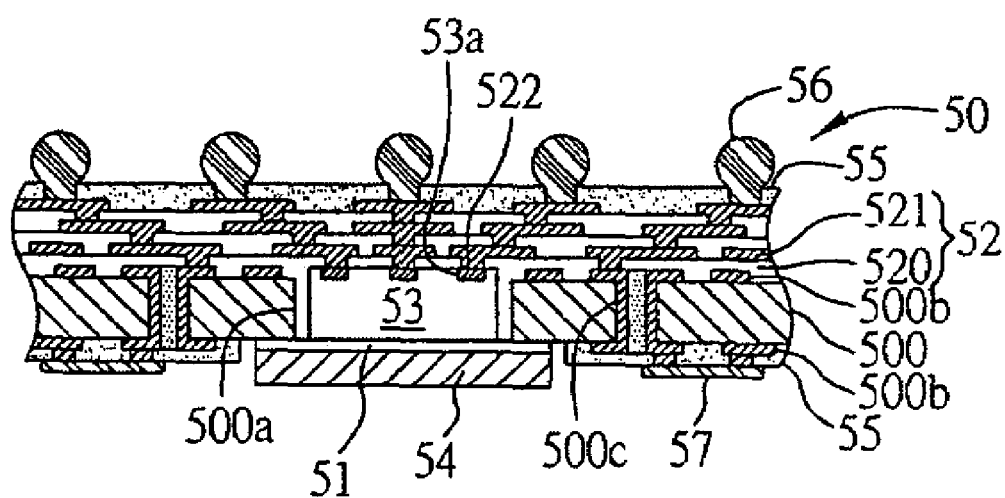
FIG. 5 is a schematic cross-sectional view of a second embodiment of the substrate assembly with direct electrical connection as a semiconductor package of the present invention.

Referring to FIG. 5, a schematic cross-sectional view of a second embodiment of the substrate assembly with direct electrical connection as a semiconductor package of the present invention is shown. In the second embodiment of the present invention, the semiconductor package structure 50 comprises: a carrier structure, wherein the carrier structure is a circuit board 500 that forms at least a cavity 500a running through its surface, and a plurality of circuit layers 500b is formed in the circuit board 500 such that the circuit layers 500b are electrically connected via interlayer conductive structures 500c such as electroplated conductive through holes or conductive vias; at lease a semiconductor chip 53 received in the cavity 500a of the circuit board, a surface of the semiconductor chip comprising electrically connecting pads 53a for electrically connections; at least a build-up circuit structure 52 formed on the semiconductor chip 53 and the circuit board 500 for receiving the semiconductor chip 53, the build-up circuit structure 52 comprising a dielectric layer 520, a circuit layer 521 formed on the dielectric layer 520, and conductive structures 522 running through the dielectric layer 520 for electrically connecting the circuit layer 521, wherein the conductive structures 522 can be conductive vias, and the conductive structures 522 are electrically connected to the circuit layers 500*b* of the circuit board 500 and the electrically connecting pads 53*a* of the semiconductor chip 53 received in the cavity 500*a* of the circuit board; and a heat sink 54 partially mounted on the circuit board 500 via a heat conductive adhesive 51 to seal the cavity 500*a* of the circuit board, the heat sink 54 contacting the semiconductor chip 53. In the structure of the present invention, a solder mask 55 can be employed to cover the surface circuits of the build-up circuit structure 52 and the portion of the circuit board 500 not covered by the heat sink 54, the solder mask 55 forming a plurality of cavities to expose the surface of the circuit portion of the build-up circuit structure 52 and the circuit board 500 for forming a plurality of conductive components such as solder balls 56 on the surface circuits of the build-up circuit structure 52, for electrically connecting the semiconductor chip 53 embedded in the circuit board 500 to external devices. A plurality of electronic components 57 are arranged on the solder mask 55 mounted at a side of the circuit board 500, so that the electronic components 57 electrically connect to the surface of the circuits portion of the circuit board 500, wherein the electronic components 57 can be active or passive components.

Consequently, the semiconductor package structure 50 of the second embodiment of the present invention is similar to the first embodiment, the main differences being that the carrier structure of the second embodiment is a circuit board, the circuit board 500 forms a plurality of circuit layers 500*b*, and the circuit layers 500*b* are electrically connected via interlayer conductive structures 500*c* such as electroplated conductive through holes or conductive vias. The circuit board 500 can also be other structures having circuit layers, which are not limited to the circuit board structure shown in FIG. 5. Subsequently, a solder mask 55 is formed at a side of the circuit board 500 (carrier structure) where the build-up circuit structure 52 is not formed, the solder mask 55 forming a plurality of openings to expose the surface of the circuits portion of the circuit board 500 for electrically connecting a plurality of electronic components 57 such as active components or passive components, so that the electronic components 57 are electrically connected to the build-up circuit structure 52 via the circuit layers 500*b* of the circuit board 500 and the interlayer conductive structures 500*c*, and further electrically connected to the semiconductor chip 53 received in the cavity 500*a* of the circuit board for enhancing the electrical properties thereof.

Figure 6:
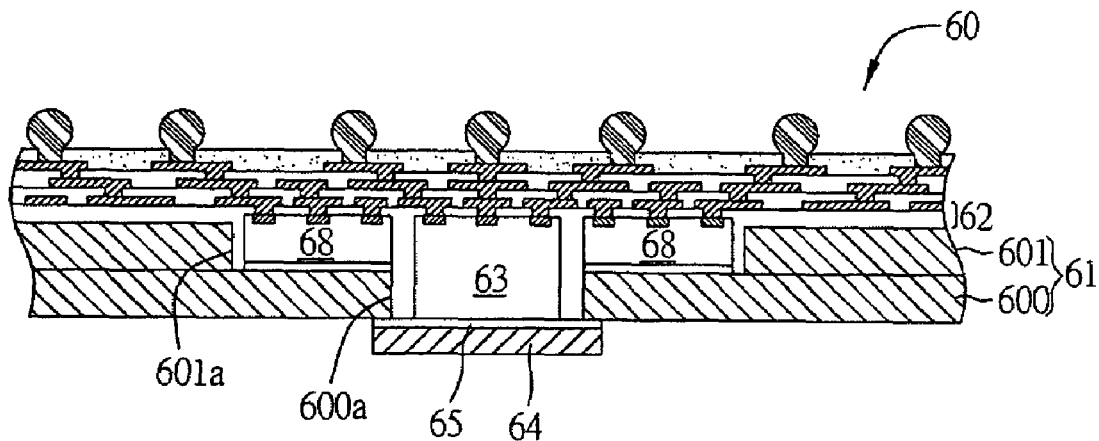
FIG. 6 is a schematic cross-sectional view of a third embodiment of the substrate assembly with direct electrical connection as a semiconductor package of the present invention.

Referring to FIG. 6, a schematic cross-sectional view of a third embodiment of the substrate assembly with direct electrical connection as a semiconductor package of the present invention is shown. The semiconductor package structure 60 of the third embodiment of the present invention is similar to the first embodiment, the main difference being that the carrier structure 61 is a multi-layer carrier board. As shown in the figure, the carrier structure 61 comprises a first carrier board 600 and a second carrier board 601. The first and second carrier boards 600, 601 can be formed of metal plate, insulating plate, or a circuit board, and the first and second carrier boards respectively form at least a cavity 600*a* running through their surfaces. The size of the cavity 601*a* of the second carrier board is greater that the cavity 600*a* of the first carrier board, and the cavity 601*a* of the second carrier board 601 is located at a position corresponding to the cavity 600*a* of the first carrier board 600, so as to mount the second carrier board 601 to the first carrier board 600, for forming receiving room to receive the semiconductor chip 63 and electronic components 68. Simultaneously, at least a build-up circuit structure 62 is formed on the semiconductor chip 63, the electronic components 68 and the second carrier board 601, for electrically connecting the semiconductor chip 63 and the electronic components 68. A heat sink 64 can be partially mounted at the position for mounting the semiconductor chip 63 on the first carrier board 600 via a heat conductive adhesive 65, so as to provide relatively greater room for the carrier structure 61 to receive other electronic components.

Additionally, the carrier structure 61 can be made of heat dissipating material such as metal or ceramic for effectively dissipating the heat of the electronic components 68 mounted on the mounting area of the multi-layer carrier structure. Furthermore, the carrier structure is not limited to a two-layer structure and can be increased to a multi-layer structure for providing more receiving room to receive electronic components.

Figure 7:
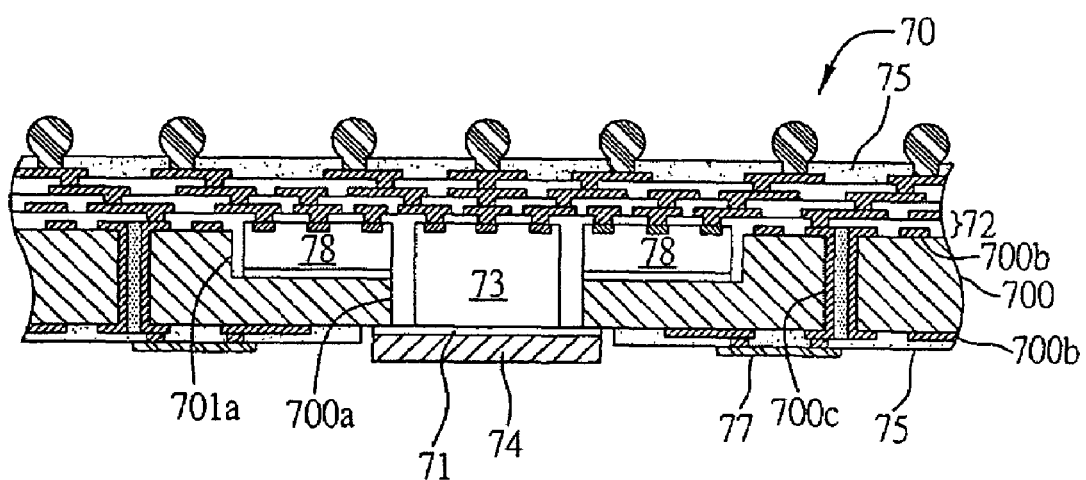
FIG. 7 is a schematic cross-sectional view of a forth embodiment of the substrate assembly with direct electrical connection as a semiconductor package of the present invention.

Referring to FIG. 7, a schematic section view of a forth embodiment of the substrate assembly with direct electrical connection as a semiconductor package of the present invention is shown. The semiconductor package structure 70 of the forth embodiment of the present invention is similar to the second embodiment, the main difference being that the carrier structure is a multi-layer circuit board 700. The circuit board 700 forms a first cavity 700*a* in a lower portion thereof, and forms a second cavity 701*a* at an upper portion thereof. The second cavity 701*a* is located at a position corresponding to the first cavity 700*a*, and the size of the second cavity 701*a* is greater than the size of the first cavity 700*a*, so as to form receiving room to receive the semiconductor chip 73 and electronic components 78. Simultaneously, at least a build-up circuit structure 72 is formed on the semiconductor chip 73, the electronic components 78, and the build-up circuit structure 72 on the circuit board 700, for electrically connecting the semiconductor chip 73 and the electronic components 78 to enhance the electrical properties thereof. Furthermore, the circuit board 700 forms a plurality of circuit layers 700*b*; and the circuit layers 700*b* are electrically connected via interlayer conductive structures 700*c* such as electroplated conductive through holes or conductive vias. Subsequently, a solder mask 75 is formed at a side of the circuit board 700 (carrier structure) at a location where the build-up circuit structure 72 is not formed, the solder mask 75 forming a plurality of openings to expose the surface circuits portion of the circuit board 700 for electrically connecting a plurality of electronic components 77 such as active components or passive components, so that the electronic components 77 are electrically connected to the build-up circuit structure 72 of the semiconductor package structure via the circuit layers 700*b* of the circuit board 700 and the interlayer conductive structures 700*c*, and further electrically connected to the semiconductor chip 73 and electronic components received in the first and second cavities 700*a*, 701*a* of the circuit board. A heat sink 74 can be partially mounted at the position for mounting the semiconductor chip 73 on the circuit board 700 via a heat conductive adhesive 71, so as to provide relatively greater room for the circuit board 700 to receive other electronic components.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A substrate assembly with direct electrical connection as a semiconductor package, comprising:
   a carrier structure having at least a cavity;
   at least a semiconductor chip received in the cavity of the carrier structure, wherein electrically connecting pads are formed on a surface of the semiconductor chip;
   at least a build-up circuit structure formed on the semiconductor chip and the carrier structure, wherein the build-up circuit structure is formed with a plurality of conductive structures electrically connected to the electrically connecting pads of the semiconductor chip, and the build-up circuit structure comprises a dielectric layer filled in a gap between the semiconductor chip and the carrier structure, a circuit layer formed on the dielectric layer, and the conductive structures formed in the dielectric layer; and
   a heat sink partially mounted to the carrier structure to seal an end of the cavity of the carrier structure, and being in contact with the semiconductor chip.

2. The substrate assembly as claimed in claim 1, wherein the carrier structure is one of a metal plate and an insulating plate.

3. The substrate assembly as claimed in claim 1, wherein the carrier structure is a multi-layer carrier board comprising at least an upper carrier board and a lower carrier boards, wherein a cavity of the upper carrier board is larger in size than a cavity of the lower carrier board, and the cavities of the upper and lower carrier boards correspond in position to each others.

4. The substrate assembly as claimed in claim 3, wherein the cavities of the multi-layer carrier board are for receiving the semiconductor chip and electronic components.

5. The substrate assembly as claimed in claim 4, wherein the semiconductor chip and the electronic components are electrically connected to the build-up circuit structure.

6. The substrate assembly as claimed in claim 1, wherein a plurality of conductive elements are formed on an outer surface of the build-up circuit structure.

7. The substrate assembly as claimed in claim 1, wherein the conductive structures are conductive vias.

8. A substrate assembly with direct electrical connection as a semiconductor package, comprising:
   a carrier structure having at least a cavity and a circuit board, the circuit board having at least a circuit layer;
   at least a semiconductor chip received in the cavity of the carrier structure, wherein electrically connecting pads are formed on a surface of the semiconductor chip;
   at least a build-up circuit structure formed on the semiconductor chip and the carrier structure, wherein the build-up circuit structure is formed with a plurality of conductive structures electrically connected to the electrically connecting pads of the semiconductor chip; and
   a heat sink partially mounted to the carrier structure to seal an end of the cavity of the carrier structure, and being in contact with the semiconductor chip; and having the build-up circuit structure, the electronic component being electrically connected to the circuit layer of the carrier structure.

9. The substrate assembly as claimed in claim 8, wherein the carrier structer is one of a single-layer circuit board and a multi-layer circuit board.

10. The substrate assembly as claimed in claim 8, wherein the build-up circuit structure comprises a dielectric layer, a circuit layer formed on the dielectric layer, and the conductive structures formed in the dielectric layer.

11. The substrate assembly as claimed in claim 10, wherein the dielectric layer is filled in a gaps between the semiconductor chip and the carrier structure.

12. The substrate assembly as claimed in claim 8, where in a plurality of conductive elements are formed on an outer surface of the build-up circuit structure.

13. The substrate assembly as claimed in claim 8, wherein the conductive structures are conductive vias.

14. A substrate assembly with direct electrical connection as a semiconductor package, comprising:
    a carrier structure having at least a cavity and a circuit board, the circuit board having at least a circuit layer, wherein the circuit board comprises an upper portion and a lower portion each of which is formed with a cavity, wherein the cavity of the upper portion of the circuit board is larger in size than the cavity of the lower portion of the circuit board, and the cavities of the upper and lower portions correspond in position to each other;
    at least a semiconductor chip received in the cavity of the carrier structure, wherein electrically connecting pads are formed on a surface of the semiconductor chip;
    at least a build-up circuit structure formed on the semiconductor chip and the carrier structure, wherein the build-up circuit structure is formed with a plurality of conductive structures electrically connected to the electrically connected pads of the semiconductor chip; and
    a heat sink partially mounted to the carrier structure to seal an end of the cavity of the carrier structure, and being in contact with the semiconductor chip.

15. The substrate assembly as claimed in claim 14, further comprising at least an electronic component mounted at a side of the carrier structure free of having the build-up circuit structure, the electronic component being electrically connected to the circuit layer of the carrier structure.

16. The substrate assembly as claimed in claim 14, wherein the cavities of the circuit board of the carrier structure are for receiving the semiconductor chip and electronic components.

17. The substrate assembly as claimed in claim 16, wherein the semiconductor chip and the electronic component are electrically connected to the build-up circuit structure.

18. The substrate assembly as claimed in claim 14, wherein the build-up circuit structure comprises a dielectric layer, a circuit layer formed on the dielectric layer, and the conductive structures formed in the dielectric layer.

19. The substrate assembly as claimed in claim 18, wherein the dielectric layer is filled in a gap between the semiconductor chip and the carrier structure.

20. The substrate assembly as claimed in claim 14, wherein a plurality of conductive elements are formed on an outer surface of the build-up circuit structure.

* * * * *